United States Patent
Ohsawa et al.

(10) Patent No.: US 6,255,826 B1
(45) Date of Patent: Jul. 3, 2001

(54) BATTERY VOLTAGE MEASURING DEVICE

(75) Inventors: Naoki Ohsawa; Takafumi Tsurumi; Tomohiko Maeda, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/688,383

(22) Filed: Oct. 17, 2000

(30) Foreign Application Priority Data

Oct. 19, 1999 (JP) ................................................. 11-297475

(51) Int. Cl.[7] .......................... G01N 27/416; H01M 10/46
(52) U.S. Cl. ............................................. 324/426; 320/116
(58) Field of Search .................................. 324/426, 430, 324/433; 320/116, 118, 119, 122, 132

(56) References Cited

U.S. PATENT DOCUMENTS

| | | |
|---|---|---|
| 4,383,211 | 5/1983 | Staler . |
| 5,430,364 | 7/1995 | Gibson . |
| 5,578,927 | 11/1996 | Perelle ................................ 324/434 |

FOREIGN PATENT DOCUMENTS 0 932 240 A2   7/1999  (EP) .

*Primary Examiner*—Edward H. Tso
(74) *Attorney, Agent, or Firm*—Armstrong, Westerman, Hattori, McLeland & Naughton, LLP

(57) ABSTRACT

The present invention provides a battery voltage measuring device capable of immediately detecting a breakage in the voltage measuring line in a battery voltage measuring device that detects the battery voltage. In blocks formed by connecting a plurality of secondary batteries in series, voltage sensors that detect the voltage of each block are respectively provided. In addition, before these voltage sensors noise filters are provided, and in addition, a measuring line breakage detecting resistor for detecting a breakage in the voltage measuring line is connected in parallel to each block. In a battery voltage measuring device having this type of structure, in the case that the voltage measuring line Q is broken, the voltage values V1 and V2 detected by the voltage sensors 20-1 and 20-2 become voltage values that accompany the resistance ratio of the measuring line breakage detecting resistors 60-1 and 60-2. Thereby, the voltage sensor detects a voltage that is not normally detected, and as a result, it becomes possible to immediately detect the breakage in the voltage measuring line.

2 Claims, 5 Drawing Sheets

BATTERY VOLTAGE MEASURING DEVICE

BACKGROUND OF THE INVENTION

1. Field of the Invention

The present invention relates to a battery voltage measuring device which detects the battery voltage in a power source device formed by connecting a plurality of secondary batteries in series, and in particular, relates to a battery voltage measuring device which quickly detects a breakage of the signal line when a signal line for voltage measurement has been broken.

2. Background Art

Conventionally, hybrid vehicles equipped with an electrical motor in addition to an engine as the drive source for driving the vehicle are known.

One type of control (mode) of these hybrid vehicles is the parallel hybrid vehicle that supplements the output of the engine using an electric motor. In this parallel hybrid vehicle, various types of control are carried out. For example, during acceleration, the electrical motor assists the output of the engine, and during deceleration, the battery is charged by deceleration regeneration. Thereby, the state of charge of the battery (that is, the remaining charge of the battery) can be maintained, while at the same time fulfilling the needs of the driver. In addition, because high voltages are required, this battery is formed by connecting a plurality of battery cells in series.

Conventionally, a battery is formed by connecting a plurality of modules in series, and each module is formed by connecting a plurality of cells in series. In the voltage detection of the battery, voltage sensors are attached to each modules and the voltage of each module is detected by respective voltage sensors. In addition, a noise filter formed by a resistors and a capacitor is interposed between each module and each sensor, and these noise filters eliminate the unnecessary noise component from the voltage signal from the battery voltage sent through the signal line. Thereby, a higher precision voltage detection is possible because an averaged voltage is input into the voltage sensor.

However, in the case of using noise filters formed by resistors and a capacitor as described above in a battery voltage measuring device, the problem arises that when a breakage occurs in the voltage measuring line, in the voltage sensor of the broken voltage measuring line, the voltage of the module is divided by the capacitor of the noise filter, and thus accurate detection of the voltage of the module is not possible.

In addition, the other problem arises that the voltage value of the module detected by the voltage sensor does not differ very much from the normal voltage value and thus a breakage occurring in the voltage measuring line cannot be detected.

As described above, in the case that breakage or other failures occur in the signal line, the detected voltage of the module on the broken signal line is different from the actual value, and accurate detection of the module voltage becomes impossible. Because of this, it becomes very important to immediately detect the breakage of this signal line and to take fail-safe actions.

SUMMARY OF THE INVENTION

In consideration of the above described problems, it is an object of the present invention to provide a battery voltage measuring device capable of immediately detecting a breakage in the voltage measuring line in a battery voltage measuring device using a noise filter comprising resistors and a capacitor.

In order to attain the above objective, the present invention provides a battery voltage measuring device (in the embodiment, the battery voltage measuring device 50) which divides a plurality of secondary batteries (in the embodiment, secondary batteries 30) connected in series into a plurality of blocks (in the embodiment, modules 10) constituted at least one battery and measures the voltage of each block, comprising voltage measurement devices (in the embodiment, voltage sensors 20) provided on each block to measure the voltage of the block, noise filters (in the embodiment what, noise filters 40) provided before the voltage measurement devices and having capacitor, and measuring line breakage detection resisters (in the embodiment, the measuring line breakage detection resisters 60) that are interposed between the blocks and the voltage measuring devices, and are connected in parallel to the blocks, wherein the resistance ratio of the measuring line breakage detection resisters corresponding to the adjacent blocks is set at at the value in which the voltage value divided by said measuring line breakage detection resisters at the time of breakage of the measuring line becomes a voltage value not normally detected when the measuring line is not broken.

An example of a conventional battery voltage detection device is shown in FIG. 3. As shown in this figure, in the conventional battery voltage detection device, voltage sensors 20 are provided for each of the modules 10, and therebetween, noise filters 40 for eliminating noise are provided. For example, as shown in FIG. 4, in a battery voltage detection device having this kind of structure, when a voltage measuring line that carries the difference in voltage between modules to the voltage sensors 20 is broken at point A, the voltage VA of the module 10-1 and the voltage VB of module 10-2 is divided by the capacitor of the noise filter, the voltage values V1 and V2 detected by voltage sensor 20-1 and voltage sensor 20-2 deviate from the actual values.

Specifically, the voltage values V1 and V2 detected by the voltage sensor 20-1 and the voltage sensor 20-2 are:

$$V1=V2=(VA+VB)/2.$$

Thus, in the case that a breakage and the like of the signal line occurs, the values of V1 and V2 that are read out become the value which is of sum of VA and VB divided by the capacitor C. In particular, in the low pass filters denoted by 40 in FIG. 3, etc., which require maintaining an equivalent time constant at each channel, the values of the capacitors C and the resistors Rs must be equivalent. Thus, these values become values divided by 2 exactly, and then $V1 \approx V2$, and the breakage failure cannot be detected.

In addition, under this condition, even if a voltage abnormality in a single module on the broken measuring line occurs, because both voltage values are averaged and an abnormality identification threshold value cannot be effectively used, the detection of an abnormality is difficult.

In contrast, according to the structure of the present invention, by the voltage measuring line breakage detection resistors inserted before each noise filter, in the case that a breakage of the voltage measuring line occurs, the voltage that is in proportion to the resistance ratio of the voltage measurement breakage detection resistor, that is, the voltage value that differs significantly when compared to the normal value, is detected by the voltage sensor, and the breakage in the voltage measuring line can be detected immediately.

In addition, simply by providing this resistor before the above-described noise filters, a complicated circuit becomes unnecessary, and thus breakage of the voltage measuring line can be detected at low cost.

In addition, the measuring line breakage detection resister according to the above-described embodiment preferably is a resistor on the MΩ order.

Because the above measuring line breakage detection resistor is a resistor that shorts each block, because this resistor value is large, the dark current can be reduced to a minimum, and the discharge of the battery during stand-by can be reduced to a minimum. As a result, at the measuring line breakage detection resistor, preferably the largest resistor value that is normally available should be selected.

Furthermore, by using a resistor with a high resistance as the measuring line breakage detection resistor, the electric corrosion of the patterns, elements, etc., of the substrate of the battery voltage measuring device due to dark current can be avoided.

In addition, in the present invention, the resistance ratio of the measuring line breakage detecting resistors corresponding to the adjacent blocks are set within a range of 1:1.5 to 1:3.

By setting the resistance of the measuring line breakage detection resistor in this manner, when an abnormality such as a broken line occurs in the voltage measuring line, the voltage value of the block is divided by the resistance ratio set in the above-described range. Thereby, the value divided by the resistor does not become an extreme value with respect to the range actually used in the voltage sensor, but in addition, neither does it become a value of such a degree that the voltage sensor cannot detect an abnormality.

As a result, a breakage in a voltage measuring line can be detected without undue overhead and quickly.

DETAILED DESCRIPTION OF THE INVENTION

Figure 1:
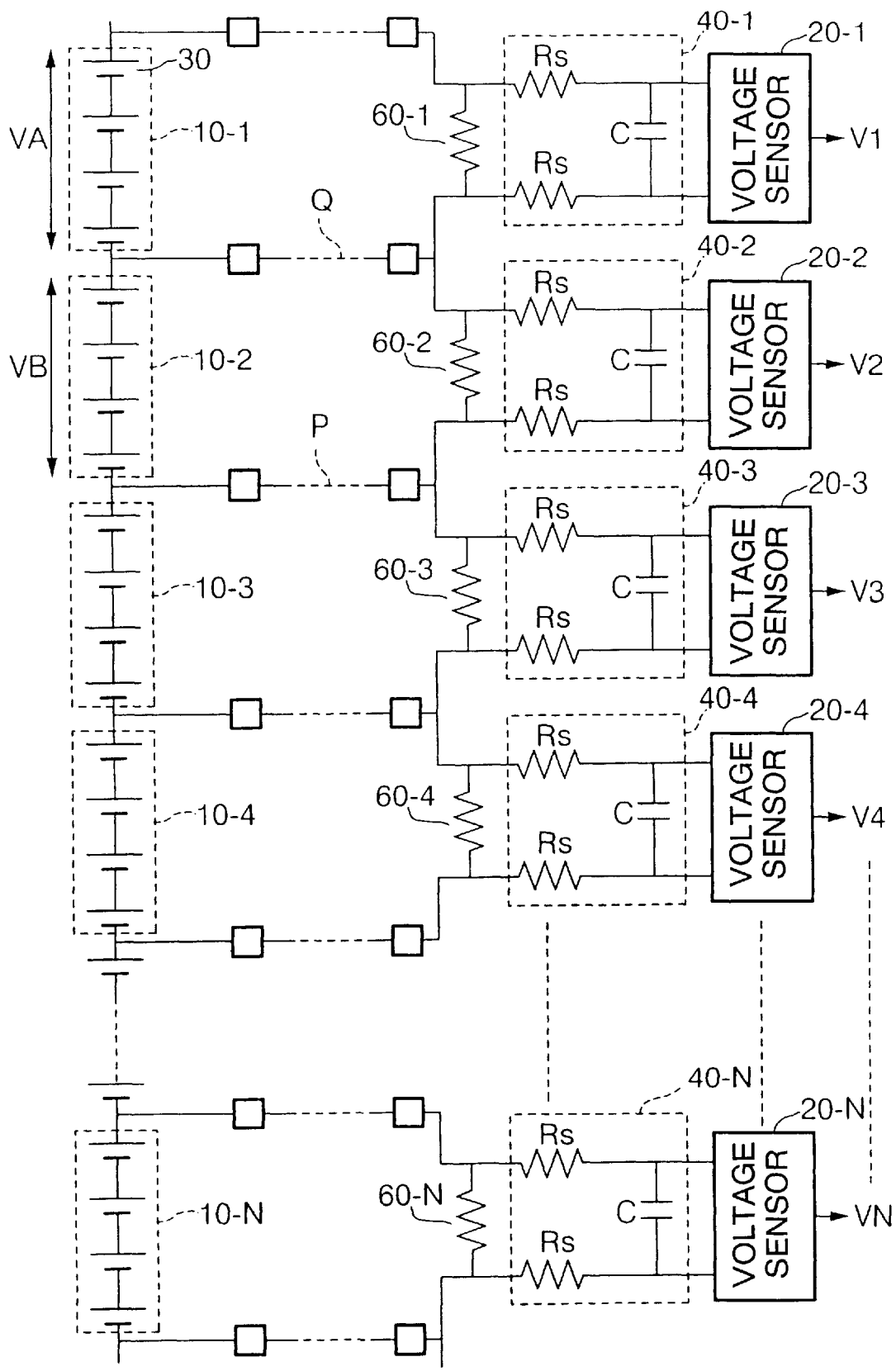
FIG. 1 is a circuit diagram showing the structure of the battery voltage measuring device according to one embodiment of the present invention.

Below, a preferred embodiment of the present invention will be explained with reference to the attached drawings. FIG. 1 is a block diagram showing the structure of the battery voltage measuring device according to one embodiment of the present invention. In this diagram, reference numeral 30 denotes secondary batteries that are the object of measurement, and modules 10 are formed by connecting a plurality of batteries 30 in series, and a plurality of modules 10 (10-1 to 10-N) are connected in series. Reference numeral 20 (20-1 to 20-N) denotes voltage sensors provided so as to correspond to each of the modules 10 (10-1 to 10-N), and are provided respectively on modules 10 (10-1 to 10-N) through noise filters 40 (40-1 to 40-N).

These noise filters 40 are low pass filters simply constituted from the resistors and the capacitor. By providing this type of noise filter before a voltage sensor, the voltage sensors 20 can measure the voltages in which the noise components have been eliminated.

In addition, between each of the noise filters 40 (40-1 to 40-N) and each of the modules 10 (10-1 to 10-N), resistors for detecting breakage of the voltage measuring line that carry the voltage between the module to the voltage sensor 20 are connected in parallel. In addition, in resistors connected to the same voltage measuring line, resistors having differing resistances are connected.

Specifically, as shown in FIG. 1, between the two resistors connected to the voltage measuring line Q, a 1 MΩ resistor is used for the voltage line breakage detection resistor 60-1, and a 2 MΩ resistor is used for the voltage line breakage detection resistor 60-2. In addition, similarly between two resistors connected to the voltage measuring line P, as described above, the voltage line breakage detector resistor 60-2 uses a 2 MΩ resistor, and the voltage line breakage detection resistor 60-3 uses a 1 MΩ resistor. In this manner, the resistors are connected such that the resistances alternate. Moreover, below, the determination of the resistance of the voltage line breakage detection resistors 60 will be explained in detail.

Figure 2:
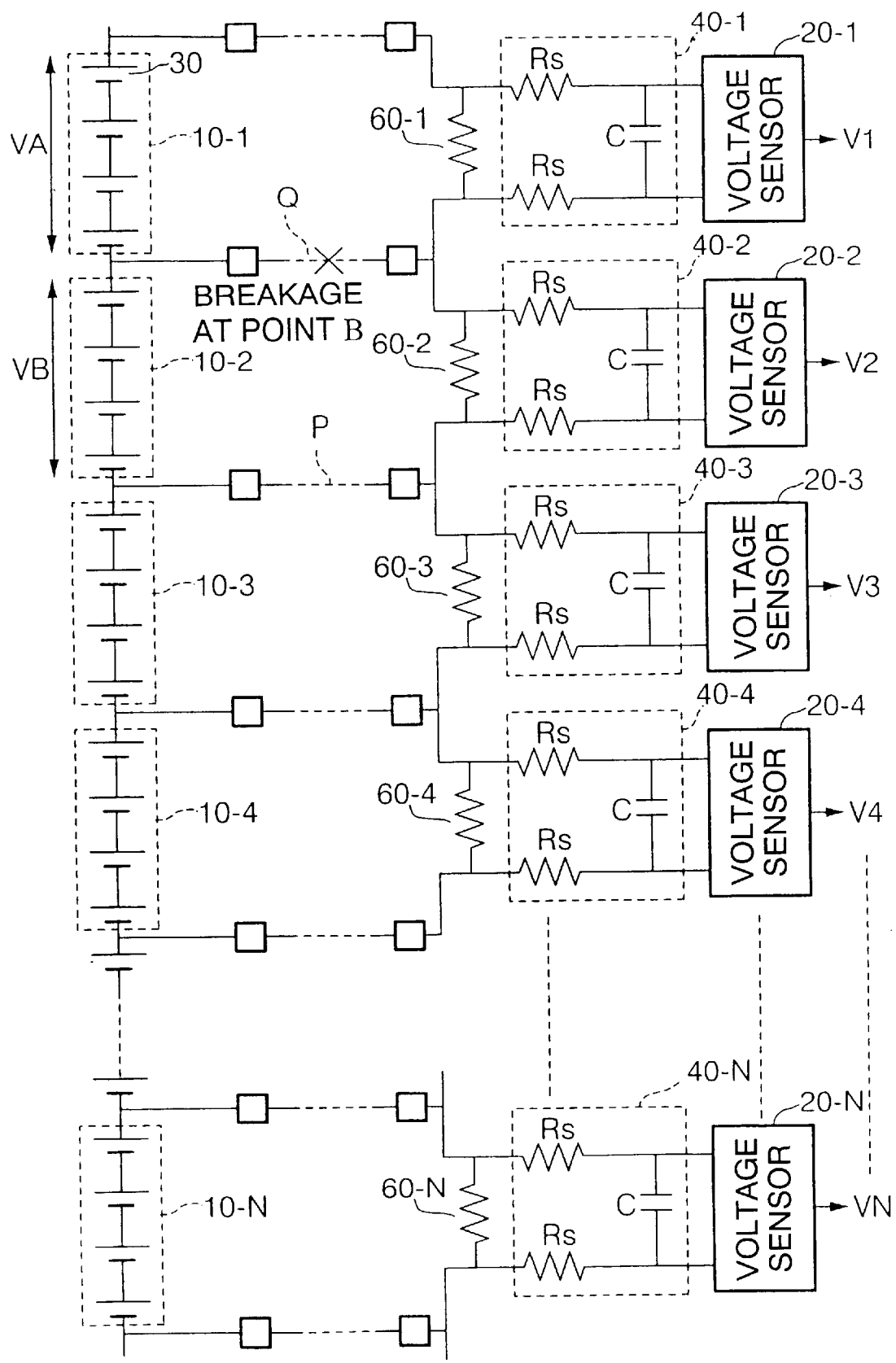
FIG. 2 is a circuit diagram for explaining the operation of the battery voltage measuring device in the same embodiment.
Figure 3:
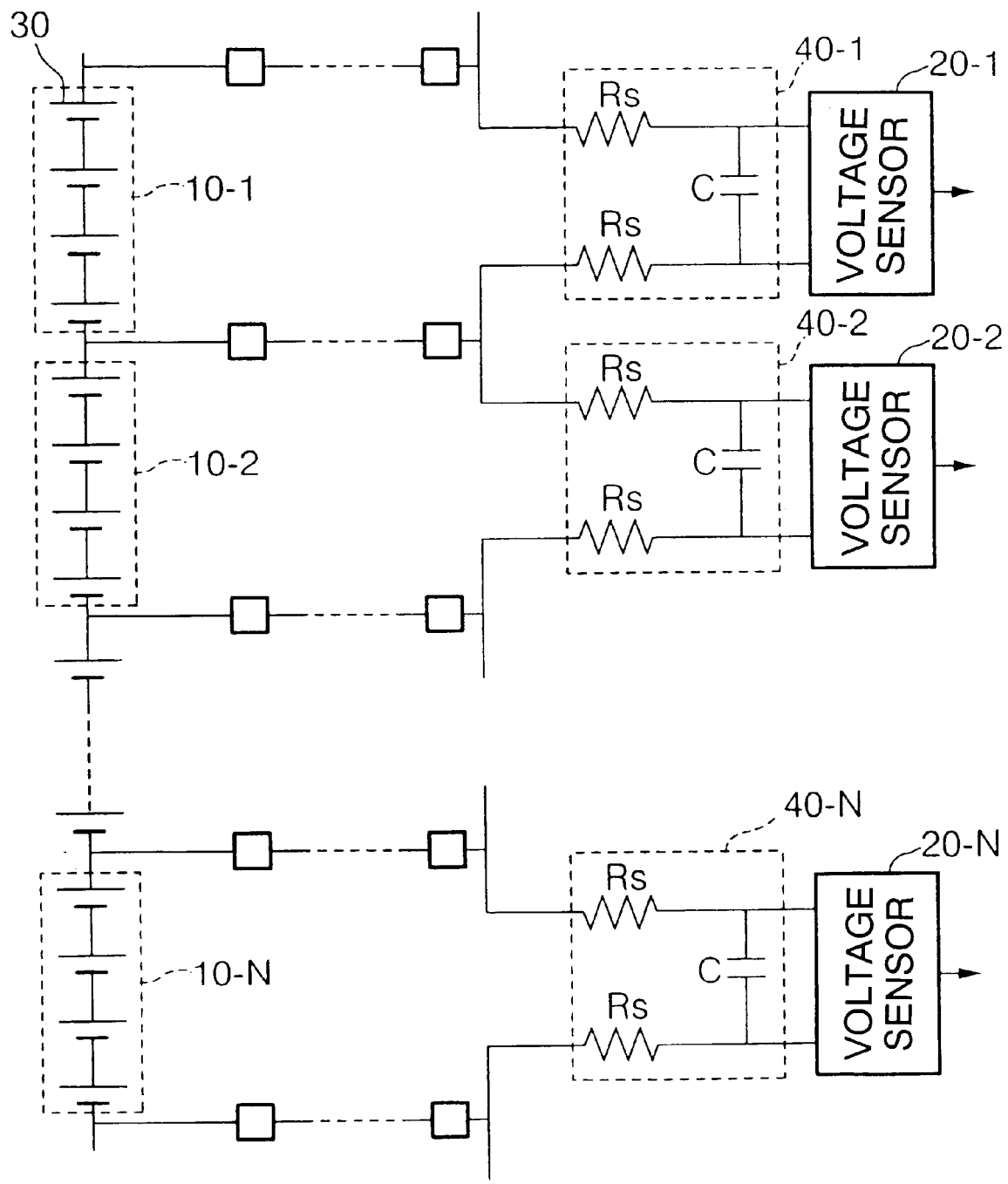
FIG. 3 is a circuit diagram showing the structure of a conventional battery voltage measuring device.
Figure 4:
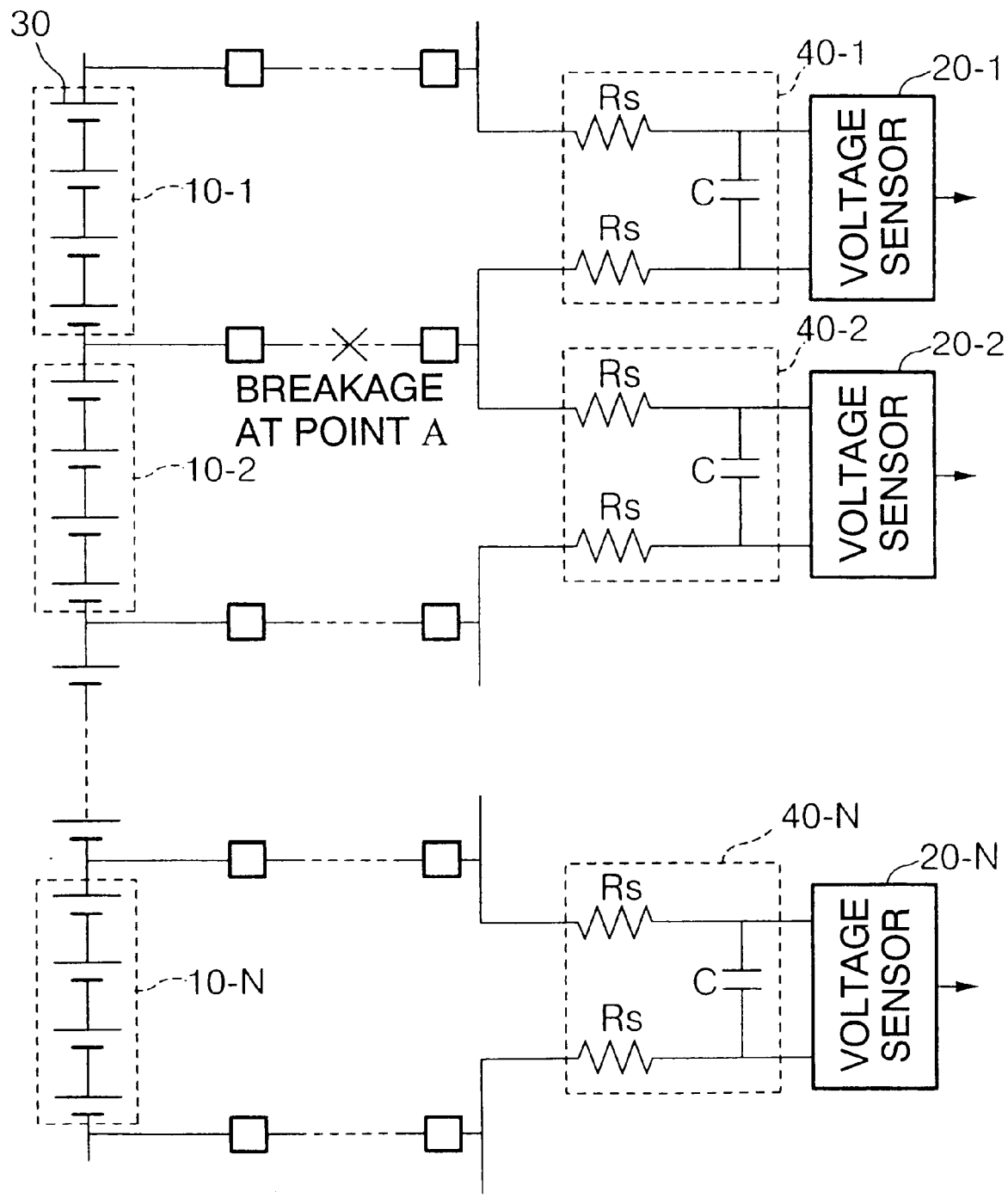
FIG. 4 is a circuit diagram for explaining the operation of a conventional battery voltage measuring device.

Next, in the battery voltage measuring device according to the above-described construction, the case of breakage at point B of the voltage measuring line is explained referring to FIG. 2.

First, in the battery voltage measuring device having the above-described construction, when the breakage occurs at point B, the voltages respectively detected at voltage sensors V1 and V2 are represented as follows, where the resistance of the voltage line breakage detecting resistor 60-1 is denoted by RA and the resistance of the voltage breakage line detecting resistor 60-2 is denoted by RB:

$$V1=(RA/(RA+RB))*(VA+VB) \quad (1)$$

$$V2=(RB/(RA+RB))*(VA+VB) \quad (2)$$

In the above equations, VA is the actual voltage value of the module 10-1, and VB is the actual voltage value of the module 10-2.

In this manner, the voltage V1 measured by the voltage sensor 20-1 and the voltage V2 measured by the voltage sensor 20-2 are values obtained by addition of the voltage VA of the module 10-1 and the voltage VB of the module 10-2, and by multiplying respective resistance ratios. Therefore, for example, in the case that the voltage line breakage detecting resistor 60-1 corresponding to module 10-1 is 1 MΩ and the voltage line breakage detection resistor 60-2 corresponding to the module 10-2 is 2 MΩ, substituting these values into the above equation (1) and equation (2) yields:

$$V1=(1/(1+2))*(VA+VB)=\tfrac{1}{3}*(VA+VB) \quad (3)$$

$$V2=(2/(1+2))*(VA+VB)=\tfrac{2}{3}*(VA+VB) \quad (4)$$

Normally, in the battery group formed by connecting a plurality of secondary batteries in series, as shown in FIG. 1, the variance in the voltage between modules is within about 10% under such conditions as, for example, that the discharged current is small. Therefore, in the case that the voltage of each module detected by the voltage sensors exceeds a variance equal to or greater than 10%, an abnormal condition can be detected.

As a result, the resistances of the measuring line breakage detecting resistors must be set so that when the voltage measuring line is broken, the voltages detected by the voltage sensors has a variance equal to or greater than 10%. Below, the method of setting the resistances of the measuring line breakage detecting resistors is explained in detail.

First, in the case that each of the modules 10 (10-1 to 10-N) is required to have a capacity to output a maximum of 20 V, the voltage sensors 20 (20-1 to 20-N) that measure this voltage must have a capacity to measure up to this value with margin added. In the measuring system, in the case that the above-described measuring line breakage detection resistance ratio is 1:3, the voltage sensor for measuring line breakage detection must have a capacity to be able to measure up to 30 V.

However, in the case that there is a necessity to measure voltage with high precision, it is not practical for the voltage sensor to have an extremely wide range with respect to the range of actual usage.

In contrast, when the above-described measuring line breakage detecting resistance ratio of 1:1.5, because the voltage value to be detected by the voltage sensor changes only slightly for the case in which a breakage of the measuring line occurs and the case in which such a breakage does not occur, this will be treated as voltage variation under normal criteria, and the breakage of the measuring line cannot be detected.

As a result, the measuring line breakage detecting resistance ratio must be set to the degree that an extremely large voltage is not generated with respect to the actual use range when a measuring line is broken, but at the same time set to a degree that the voltage value detected by the voltage sensor is not within the normal variance criteria for the voltage value for the cases in which a breakage of the measuring line occurs and the case in which it does not occur.

In addition, this measuring line breakage detecting resistor is a resistor that shorts each module, and thus when this value becomes small, because there is concern about an increase in the dark current and electrolytic corrosion of the circuit pattern occur, a maximum resistance that is normally available, for example, 1 MΩ or 2 MΩ, is selected.

It is noted that, although in the above-described embodiment, a case is explained in which each battery are formed by connecting a plurality of modules in series and each module is formed by connecting a plurality of cells in series, this can be applied to a battery formed by a single battery cell.

Moreover, the present invention is not limited to the embodiment, but can be realized by appropriately altering the embodiment thereof without departing from the scope of the invention.

Next, as an applied example of the voltage detecting device of the present invention, the case of an application to a voltage detector in the battery of a parallel hybrid vehicle will be explained referring to the attached drawings.

Figure 5:
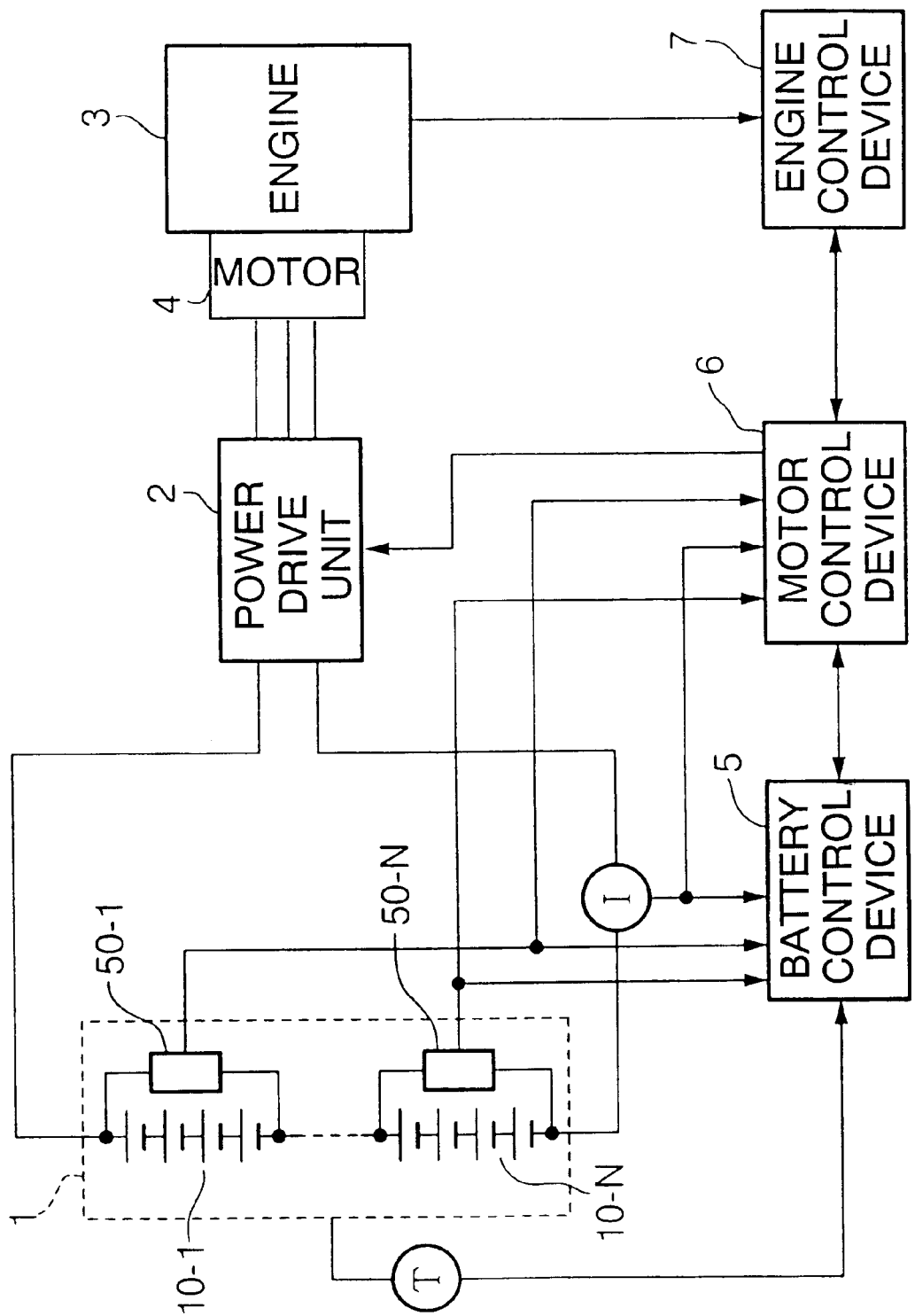
FIG. 5 is a block diagram showing the entire structure of a parallel hybrid vehicle, which is one type of hybrid vehicles.

FIG. 5 shows the schematic structure of a parallel hybrid vehicle. In this figure, reference numeral 1 denotes a high voltage battery which is formed by modules 10 (10-1, 10-2, . . . ) having a plurality of cells connected in series serving as a unit, and these modules are further connected in series. In each module, battery voltage measuring devices 50 (50-1, 50-2, . . . ) that detect voltage are provided, and the voltage values of each module measured by the battery voltage measuring devices 50 are output to the battery control device 5.

In addition, the current sensor that detects the current flowing in the battery 1 and the temperature sensor that detects the temperature of the battery 1 respectively detect the current and temperature at a predetermined timing, and output these values to the battery control device 5.

Reference numeral 2 denotes a power drive unit that is formed by three units of switching elements, such as IGBT, connected in parallel, wherein each unit is formed by two switching element connected in series.

Reference numeral 3 denotes an engine that operates using the combustion energy of a fuel, and reference numeral 4 is an electrical motor used together with the engine and operating using electrical energy. The driving force of both the engine 3 and the motor 4 is transmitted to drive wheels (not illustrated) through a transmission (not illustrated) comprising automatic transmission or manual transmission. In addition, during deceleration of the hybrid vehicle, the drive force is transmitted from the drive wheels to the motor 4, the motor 4 generates what is termed regenerative braking force by functioning as a generator, and the battery 1 is charged. It is noted, in addition to, but separate from the drive motor 4, the structure of the hybrid vehicle may provide a generator for charging the battery 1.

The drive and regeneration of the motor 4 is carried out by the power drive unit 2, which receives a control command from the motor control device 6. Specifically, by turning ON and OFF the switching elements in the power drive unit 2 by the motor control device 6, the electric power from the battery 1 is supplied to the motor 3 through three-phase wiring, and the regenerative electrical power of the motor 2 is supplied to the battery 1.

Reference numeral 5 denotes a battery control device that receives at predetermined timings the voltages (V1 to Vn) of each module that forms the battery 1 from the voltage sensors 20 (20-1 to 20-N), the battery current Ibatt that flows through the battery from the current sensor, and the temperature Tbatt of the battery 1 from the temperature sensor, and calculates the remaining charge SOC (state of charge, that is, the remaining battery charge) of the battery 1 from these output values.

Reference numeral 7 denotes an engine control device that monitors the engine speed NE, the vehicle speed, etc., at predetermined intervals, and determines whether the vehicle's mode is, for example, motor regeneration, assistance, or deceleration. In addition, at the same time, as a result of the determination of the above mode determination, the engine control device 7 determines the assistance/regeneration amount based on the state of charge SOC sent from the battery control device 5.

Moreover, the battery control device 5, the motor control device 6, and the engine control device 7 are formed by a CPU (central processing unit) and memory, and the functions thereof are realized by executing a program that realizes the functions of the control devices.

In a hybrid vehicle having the above-described structure, the battery voltage measuring devices 50 provided in plurality on the battery 1 are the battery voltage detection device of the present invention, and as shown in FIG. 1, voltage sensors 20 are provided respectively on each module constructed by connecting in series a plurality of cells, and between each of the modules 10 and each of the voltage sensors 20, a noise filter comprising a capacitor and resistors is interposed, and additionally, a measuring line breakage detection resistor is connected in parallel to each module.

In addition, the above-described voltage sensors 20 (20-1 to 20-N) measure the voltage of the modules 10 (10-1 to 10-N) based on continuous or periodic timing, and this measurement result is output to the battery control device 5 at a predetermined timing. Here, in the case that the measuring line of the voltage measuring device is broken, the two voltage sensors having the broken measuring line measure the voltage (refer to equations 1 and 2) determined by the ratio of the respective measuring line breakage detecting resistors, and these voltages are output to the battery control device 5.

When the battery control device 5 receives the voltage of each module from each voltage sensor, first the variation of the received voltage values for each module is detected. At this time, if any of the measuring lines of the voltage measuring device are broken, the voltage values detected by the voltage sensor on this measuring line become values that deviate significantly from the voltage values of the other modules. As a result of this, the variation of the voltage of each module detected by the battery control device 5 becomes comparatively larger than normal.

The battery control device 5 determines the variation of the voltage of each of these modules, and when it determines that the variation is large in comparison to the normal variation, it detects that somewhere among the modules or battery voltage measuring devices 50 an abnormality has occurred, and outputs abnormality occurrence signals to the motor control device 6 and the engine control device 7, and then takes appropriate action towards the detected abnormality.

In contrast, in the case that the variation in voltage of the modules is determined to be in the normal range by the battery control device 5, the voltage of all modules detected by voltage sensors 20 (20-1 to 20-N) are added, and the total voltage of the battery 1 is calculated. In addition, when the battery control device 5 receives the battery current Ibatt from the battery current sensor and the battery temperature Tbatt from the battery temperature sensor at the same timing, it calculates the state of charge SOC of the battery 1 from the voltage, current, and temperature of this battery.

In addition, the battery control device 5 outputs at a predetermined timing the calculated remaining charge SOC of the battery 1 to the motor control device 6, and the motor control device 6 and the engine control device 7 respectively control the motor and engine using this state of charge SOC of the battery 1 as one parameter for controlling the hybrid vehicle.

In this manner, because the voltage of battery 1 can be accurately detected by the high precision battery voltage measuring devices 50 by detecting the voltage of the battery, the control of each component of the hybrid vehicle can also be carried out accurately. In addition, because the battery voltage measuring device of the present invention is small sized and low cost, cost reductions can be implemented by using this battery voltage measuring device.

As explained above, according to the battery voltage measuring device of the present invention, a voltage measuring line breakage detecting resistor is provided in parallel to each corresponding block. Thereby, in the case that a breakage in the voltage measuring line occurs, the voltage accompanying the resistance ratio of the voltage measuring line breakage detection resistor, that is, a voltage value that deviates significantly when compared to normal, is detected.

Thereby, the effect is attained that the breakage in the voltage measuring line can be detected quickly.

In addition, when carrying out breakage detection of the voltage measuring line, simply by providing a resistor, a complicated circuit is unnecessary, and thus the effect is attained that a breakage in the voltage measuring line can be detected at low cost.

In addition, by using the measuring line breakage detecting resistor having a resistance in the MΩ order, the dark current can be reduced to a minimum, and the discharge of the battery during stand-by can be reduced to a minimum.

In addition, the electrolytic corrosion of the pattern of the substrate and the elements of the battery voltage measuring device due to dark current can be avoided.

What is claimed is:

1. A battery voltage measuring device in which a plurality of secondary batteries connected in series is divided into a plurality of blocks constituted of at least one secondary battery, and which measure the voltage of each block, comprising:

a voltage measuring device provided on each of said blocks for measuring the voltage of said blocks;

a noise filter provided before said voltage measuring device and having a capacitor; and a measuring line breakage detecting resistor, which is interposed between each of said blocks and said voltage measuring devices, and is connected in parallel to said blocks;

wherein the resistance ratio of the measuring line breakage detection resistors corresponding to adjacent blocks is set at the value in which the voltage value divided by said measuring line breakage detection resistors at the time of breakage of the measuring line becomes a voltage value not normally detected when the measuring line is not broken.

2. A battery voltage measuring device according to claim 1, wherein the resistance ratio of said measuring line breakage detection resistors corresponding to adjacent blocks is set within a range of 1:1.5 to 1:3.

\* \* \* \* \*